United States Patent [19]

Oguchi et al.

[11] 4,336,447
[45] Jun. 22, 1982

[54] CONVERTER OF METER-GAUGE READINGS

[75] Inventors: Yuzo Oguchi; Takayuki Itakura, both of Suwa; Akio Kawano, Osaka, all of Japan

[73] Assignee: Osaka Gas Co., Ltd., Osaka, Japan

[21] Appl. No.: 128,352

[22] PCT Filed: Nov. 14, 1978

[86] PCT No.: PCT/JP78/00025
  § 371 Date: Jul. 16, 1979
  § 102(e) Date: Jul. 9, 1979

[87] PCT Pub. No.: WO79/00293
  PCT Pub. Date: Apr. 31, 1979

[30] Foreign Application Priority Data

Nov. 14, 1977 [JP] Japan .......................... 52-136374
Nov. 8, 1978 [JP] Japan .......................... 53-153639

[51] Int. Cl.$^3$ ................... G06M 1/276; G08C 19/16
[52] U.S. Cl. .......................... 235/92 EA; 235/92 MT; 340/870.02
[58] Field of Search .......... 235/92 EA, 92 C, 92 MT, 235/92 EL, 92 FL; 346/14 MR; 340/870.02, 870.27

[56] References Cited

U.S. PATENT DOCUMENTS

| | | | |
|---|---|---|---|
| 2,813,677 | 11/1957 | Scarbrough | 235/92 |
| 3,387,267 | 6/1968 | Little | 340/870.02 |
| 3,518,652 | 6/1970 | Dransfield et al. | 340/870.27 |
| 3,656,133 | 4/1972 | Ichikawa et al. | 340/207 |
| 3,721,806 | 3/1973 | Stothart | 235/92 EA |
| 3,723,711 | 3/1973 | Kamata et al. | 235/92 EA |
| 3,962,691 | 6/1976 | Langenfeld | 340/870.27 |

FOREIGN PATENT DOCUMENTS

1258305 1/1966 Fed. Rep. of Germany .
2138070 2/1975 Fed. Rep. of Germany .
1356944 6/1974 United Kingdom .

Primary Examiner—Joseph M. Thesz
Attorney, Agent, or Firm—Stevens, Davis, Miller & Mosher

[57] ABSTRACT

A quantity converting and indicating apparatus for use in automatic remote systems for inspecting consumed amounts of gas, city water, electric power or the like, by which a detected value in the decimal system displayed on such a counter as a gas meter is converted to a binary system value convenient for transmission by a channel such as a telephone circuit. The apparatus is provided with plural cams (2) cooperative with a figure wheel (4) of the counter for converting the detected value to the binary system value, plural vibrators (6a) placed facing each cam and fixed each at one end, flexible vibrator controlling members (5) placed adjacent to the concaves and convexes (2a, 2b) of each cam and facing the respective vibrators at their other ends for controlling the vibrators, means (10) for activating the vibrators, and means (7, 8) for converting the vibration to an A.C. signal having a frequency in a band adopted for transmission by means such as a telephone circuit.

11 Claims, 16 Drawing Figures

CONVERTER OF METER-GAUGE READINGS

TECHNICAL FIELD OF THE INVENTION

The present invention relates to a converter of meter-gauge readings for converting the readings of a house hold meter-gauge to indicate the consumption of gas, water or electric power into an electric AC signal of binary code so that the readings of the house hold meter-gauge can be transmitted over a telephone channel and the like.

BACKGROUND TO THE INVENTION

Lately introduction of an automatic remote-checking system of meter-gauge readings for gas, water or electric power consumption over the telephone channel has come to be considered so that the job of checking the meter-gauge readings can be made efficient and this checking can be done any time. As the conventional readings-converter for such an automatic checking system, there is, for instance, the following device. Namely, a meter-gauge is equipped with a figure-wheel to give the readings and this figure-wheel normally carries figures in decimal code. Binary codes corresponding to these decimal code figures are given on said wheel in the form of magnetic information or indentation, which is converted to an electric signal by a magnetic head or a microswitch and so on which is provided alongside the wheel. An AC signal modulated by this electric signal is sent over the telephone channel. In this device, therefore since the figure-wheel has a singular configuration, an ordinary figure-wheel must be modified for this purpose. And in this device, since a magnetic head or a microswitch is needed to identify the magnetic information or indentation on the figure-wheel, electric circuits for transmission and modulation and the like and a power source to drive these circuits are indispensable.

SUMMARY

The present invention relates to a converter of meter-gauge readings to be used for automatic remote checking of the readings or a gas-, a water- or an electric power meter-gauge.

Said converter serves to make a decimal-binary conversion of the readings of such a meter-gauge to enable transmission over the telephone channel and so on. Namely, the readings of the figure-wheel in such a meter-gauge are rendered into binary codes by binary cams; and the oscillation of oscillators matching said binary codes is controlled and converted to an AC signal. The frequency of said AC signal fits into the allowable frequency band of the transmitting means such as telephone channel. Thus according to the present invention, a power source or a complicated electric circuit is needless, and the converter can be attached to the existing meter-gauge without any modification.

DISCLOSURE OF THE INVENTION

According to the present invention, the readings of the figure-wheel in a meter-gauge are changed to binary codes by means of a series of binary cams. Oscillators corresponding to these binary codes are controlled to two different states of oscillation and thereby the oscillation of each oscillator is converted to an AC signal. The frequency of this AC signal is set such as to fit into the allowable frequency band of the transmitting means like the telephone channel. To be more specific, oscillators are provided corresponding to a plurality of binary cams for changing the meter-gauge readings to binary codes. Each oscillator has an oscillating means. By means of the indention formed on the face of each cam to represent the binary code and by means of a control piece which controls the oscillator to two states of free oscillation and restricted oscillation, depending on said indention, the oscillation of the oscillator is controlled corresponding to the readings in binary code. Thus the oscillation converted to an AC signal is transmitted over the telephone channel. The means to oscillate said oscillator in the present invention is the energy released from storage in spring means such as a coil spring. Accordingly the present invention needs no electric power supply, no intricate electric circuit; with a simple mechanism it can reliably convert the meter-gauge readings to an electric signal favourable for transmission over the telephone channel.

Moreover according to the present invention, the existing figure-wheel of the meter-gauge need not be modified at all and the readings-converter in this invention can be readily attached to the conventional meter-gauge as it is.

BRIEF ACCOUNT OF THE ATTACHED DRAWINGS

FIG. 5 (b) shows a waveform of an oscillator in restricted oscillation.

BEST MODE OF EMBODIMENT

First, referring to FIGS. 1-7, the first embodiment of the invention is described.

Figure 1:
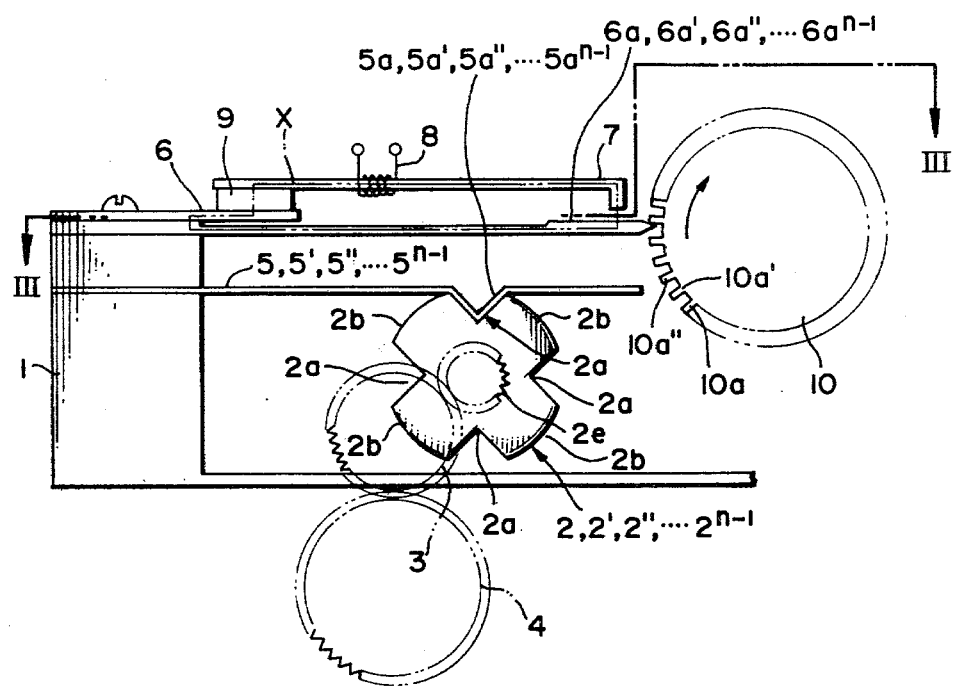
FIG. 1 is a front elevation view of a device as one embodiment of the present invention.

On the machine frame 1 are arranged cam pieces 2,2', 2"—$2^{n-1}$, corresponding to the number of digits in the figure to be converted and these pieces are rotatably supported. In the case of a gas meter-gauge which usually gives readings in 8 digits, the upper 4 digits alone may be used with little error and so the cam pieces 2,2',2"—$2^{n-1}$ will be four when the upper 4 digits alone may be taken as data. FIG. 1 shows only the cam piece 2 which is the closest to you, out of the n pieces.

On the face of each of cam pieces 2, 2', 2''—$2^{n-1}$ there are formed concave V-grooves 2a, 2a, 2a, 2a. The convex parts 2b, 2b, 2b, 2b formed on the same face of each cam piece alternate with said V-grooves 2a, 2a, 2a, 2a, separated by a specific distance. On one side of each of said cam pieces 2'—$2^{n-1}$ there are formed successive teeth 2c with a specific interval and on the other side digit-adding teeth 2d staggered in phase by a specific distance from the convex parts 2b, 2b, 2b, 2b, of said cam pieces 2, 2', 2''—$2^{n-1}$. Said digit-adding teeth $2d$ constitute a sort of an imperfect gear.

On the outside of the cam piece 2 which is the closest to you there is fitted a small gear 2e, which meshes via a medium gear 3 with the figure-wheel 4 of, say, a gas meter-gauge not shown. Said figure-wheel 4 indicates the lowest digit of data to be converted. Meanwhile, inside of the cam piece 2 which is the closest to you there are formed successive teeth with an equal interval, just as on the other cam pieces 2', 2''—.

Between the adjoining cam pieces 2, 2'—$2^{n-1}$ there are the digit-adding gears 51, 51, 51 — positioned. Now in FIG. 4, the digit-adding gear 51 is rotatably fitted between the cam pieces 2' and 2'' and at a specific distance from said gear 51 there are formed wide teeth 51a, 51a—. Between these wide teeth 51a, 51a — come narrow teeth 51b, 51b—. Said narrow teeth 51b, 51b — mesh all the time with the teeth 2c of the cam piece 2', while said wide teeth 51a, 51a — are able to mesh simultaneously with both the teeth 2c of the cam piece 2' and the digit-adding teeth 2d, 2d — of the cam piece 2''.

Hold pieces 5, 5', 5''—$5^{n-1}$ made of flexible material have one end fixed to and supported by the machine frame 1 and the other end positioned opposite to the cam pieces 2, 2', 2''—$2^{n-1}$. Since said hold pieces 5, 5', 5''—$5^{n-1}$ correspond respectively to said cam pieces 2, 2', —$2^{n-1}$, said hold pieces correspond respectively also to the oscillators 6a, 6a'—$6a^{n-1}$ of oscillation valves 6 to be described later. Said hold-pieces 5, 5', 5''—$5^{n-1}$ have V-bends 5a, 5a', 5a''—$5a^{n-1}$ on mid-portion. Said V-bends normally engage the corresponding faces of said cam pieces 2, 2', 2''—$2^{n-1}$ by virtue of the elasticity of said hold-pieces themselves.

On the machine frame 1 one end of the oscillation valve 6 is fixed and on the other end of said valve 6 are formed the oscillators 6a, 6a', 6a''—$6a^{n-1}$ corresponding to the cam pieces 2, 2'—$2^{n-1}$. Said oscillators 6a, 6a'—$6a^{n-1}$ are equal in length.

A pickup 7 is placed at a specific distance from each of top sides of the oscillators 6a, 6a', 6a''—$6a^{n-1}$. Said pickup 7 is wound with an coil 8 for taking out output. The end of said pickup 7 is fixed via the magnet 9 to the machine frame 1. Said magnet 9, said pickup 7, said oscillators 6a, 6a'—$6a^{n-1}$ and said oscillation valve 6 constitute a magnetic circuit X.

Ahead of the tip of the oscillator 6a, 6a', 6a''—$6a^{n-1}$ of the oscillation valve 6 there is a drum 10 rotatably supported and on the periphery of said drum 10 jut out the pins 10a, 10a', 10a'', —$10a^{n-1}$ to oscillate the oscillators 6a, 6a', 6a''—$6a^{n-1}$ respectively. Said pins 10a, 10a', 10a''—$10a^{n-1}$, being spirally disposed, can successively flip the oscillators 6a, 6a', 6a'', —$6a^{n-1}$.

11 denotes a barrel such as provided in a music box to hold a spring therein. The energy released from this spring is transmitted as a torque to the drum 10 via the wheel row 12, thereby causing the drum 10 to rotate. Said wheel row 12 meshes with another wheel row 13, which in turn engages a rotatable vane 14. In the vicinity of said vane 14 the control piece 15 can pop out or in within the rotatable range of said vane 14 and said control piece 15 interlocks with a plunger or the like not shown.

The function in the first embodiment is described here.

The gas meter-gauge is a decimal one in which the figure-wheel 4 rotates by one figure as the figure-wheel 4 for lower digit than the figure-wheel 4 changes from "9" to "0". Rotation of the figure-wheel 4 causes the cam piece 2 to turn via the medium gear 3 and the small gear 2e, whereby the cam piece 2 rotates $\frac{1}{8}$ turn of the face of the cam piece 2 from the convex 2b to the concave V-groove 2a or from the V-groove 2a to the convex 2b (hereafter $\frac{1}{8}$ turn of the cam piece is called one step rotation). When the figure-wheel 4 turns by one more figure and thereby the cam piece 2 makes one step rotation, the digit-adding tooth 2d of the cam piece 2 meshes with the wide tooth 5a of the digit-adding gear 5, whereby the one step rotation of said cam piece 2 is transmitted to the cam piece 2', causing one step rotation of the cam piece 2'. Thus, every two steps of the lower cam piece rotation causes one step rotation of the upper cam piece; and with rotation of the figure-wheel 1, the cam pieces repeat this action successively. In this manner binary digit-adding of the cam pieces 2, 2', 2''—$2^{n-1}$ is done.

Figure 2:
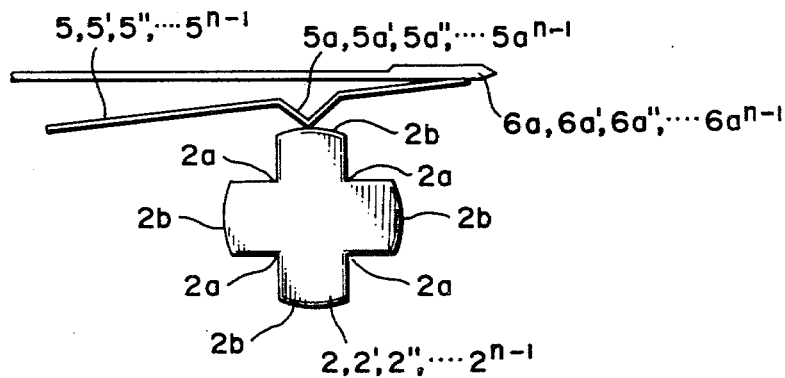
FIG. 2 is an elevation view of the principal part of the device in FIG. 1 showing its action.

If the convex 2b and the concave V-groove 2a in the cam pieces 2, 2', 2''—$2^{n-1}$ are made to correspond to the binary code "0" and the binary code "1" respectively, the decimal readings of the figure-wheel 4 in the meter-gauge can be converted to binary ones. If then the V-bends 5a, 5a', 5a''—$5a^{n-1}$ of the hold pieces 5, 5', 5''—$5^{n-1}$ are in engagement with the convex 2b of the cam pieces 2, 2'—$2^{n-1}$, as indicated in FIG. 2, they are bearing against the backside of the corresponding oscillators 6a, 6a'—$6a^{n-1}$; and if they are in engagement with the V-groove 2a, as indicated in FIG. 1, they are off the corresponding oscillators 6a, 6a'—$6a^{n-1}$.

Thus as the gauge of gas meter or the like acts and the figure-wheel 4 turns, the cam pieces 2, 2', 2''—$2^{n-1}$ will make step rotation, thereby effecting a decimal-binary conversion of the readings.

Figure 3:
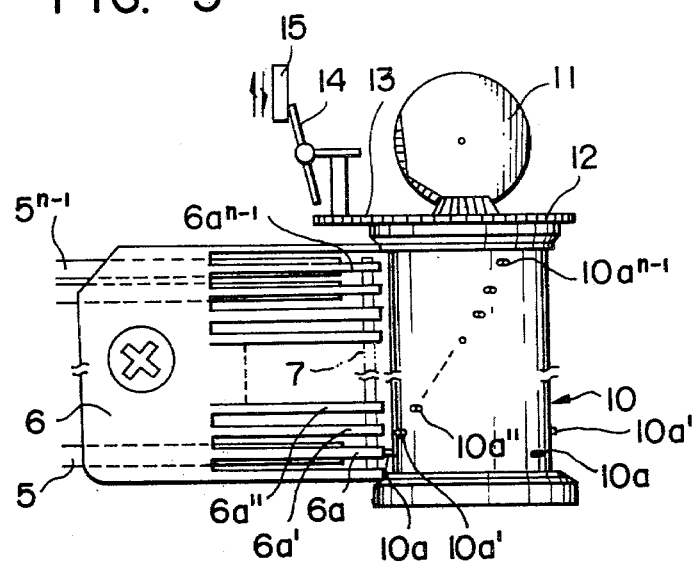
FIG. 3 is a plan view of the same device as viewed in a direction along III—III in FIG. 1.
Figure 4:
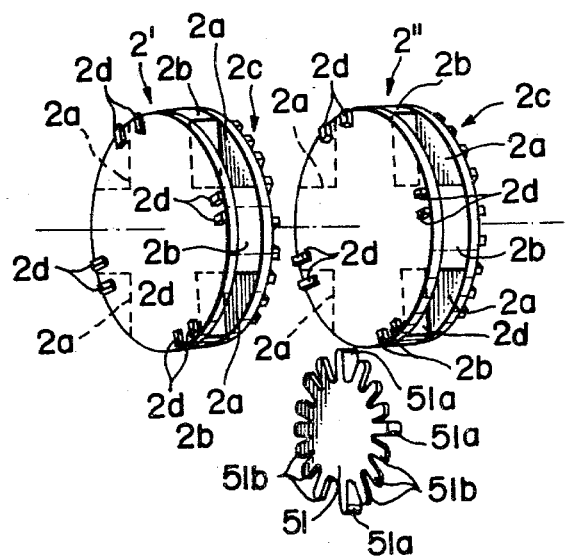
FIG. 4 is an oblique view of a cam.

Now when you want to check the readings of the meter-gauge, you issue an external signal to make the control piece 15 move upward in FIG. 3, thereby to disengage the vane 14 from the control piece 15.

Then the wheel row 13 becomes free to rotate and the released energy of the coil spring is transmitted via the wheel row 12 to the drum 10, causing the drum 10 to rotate. With rotation of the drum 10, the pins 10a-$10a^{n-1}$ successively flip the oscillators 6a—$6a^{n-1}$.

Figures 5A, 5B:
FIG. 5 (a) shows a waveform of an oscillator in free oscillation.

Oscillation of the oscillators 6a- $6a^{n-1}$ changes the gap between the pickup 7 and the oscillators 6a- $6a^{n-1}$ and in consequence the magnetic resistance in the magnetic circuit X changes (magnetic flux change), thereby inducing a voltage. This induced voltage has an AC wave form as indicated in FIG. 5, its frequency, which depends on the frequency of the oscillators 6a- $6a^{n-1}$, being in the range of 300 –3000 Hz, which virtually corresponds with the allowable frequency band for a telephone channel etc. The oscillating mode of the oscillators differs depending on whether the oscillators are being held by the hold pieces 5-$5^{n-1}$ or not. The oscillation of the oscillators lasts long when they are not held by the hold pieces, as shown in FIG. 5(a); and when they are held by the hold pieces, their oscillation, being absorbed by said hold pieces as shown in FIG. 5(b), immediately ceases. Thus from the output end of the coil 8 emerge successive waveforms as shown in FIG. 5(a) or (b) in binary representation given by the cam pieces $2 - 2^{n-1}$.

In the first embodiment in which the data are produced in series, the oscillators $6a - 6a^{n-1}$ have only to be approximately equal in length and there is no need to set an exact frequency of the oscillators $6a - 6a^{n-1}$ by tuning the valve.

Figure 6:
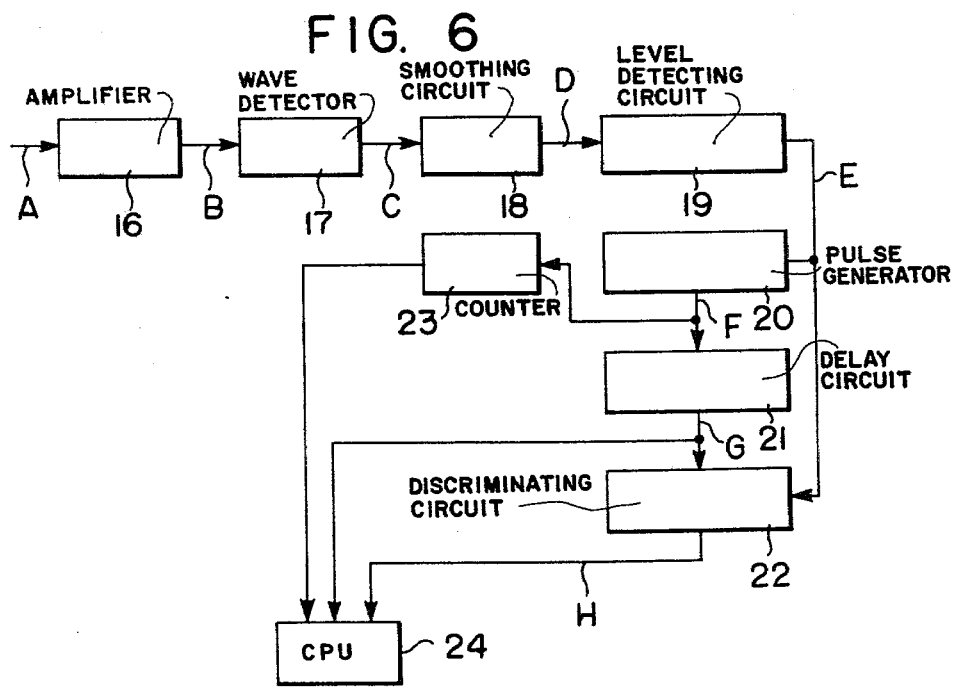
FIG. 6 is a diagram illustrating a regenerating circuit.

The waveforms are transmitted over a telephone channel by a transmitting means not shown and received by the receiving circuit as shown in FIG. 6. The receiving action is explained as follows.

Figure 7:
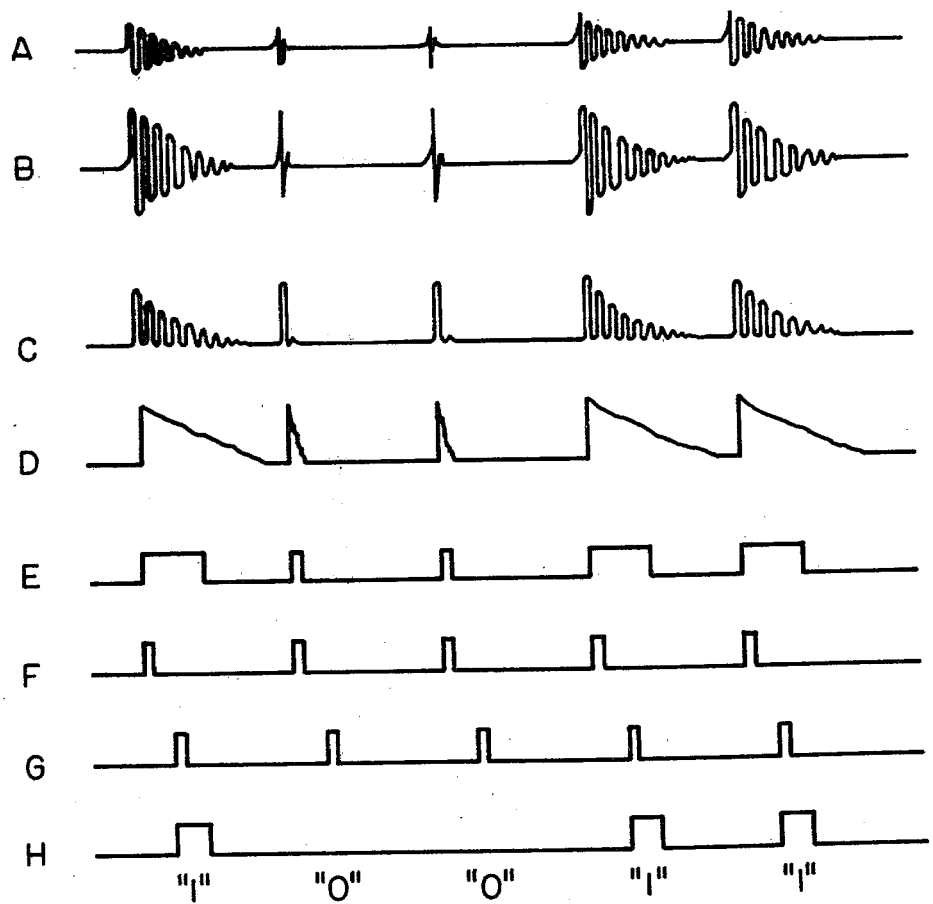
FIG. 7 shows a waveform at A or at H in the regenerating circuit of FIG. 6.

First a waveform as illustrated by A in FIG. 7 which comes over the telephone channel is amplified by the amplifier 16, yielding a waveform B. The waveform B is detected by the wave detector 17, yielding a waveform C. The waveform C is smoothed by the smoothing circuit 18, yielding a waveform D. The waveform D is detected at a specific level by the level detecting circuit 19, yielding a rectangular waveform E. The waveform E is long when it has a pulse width "1" and short when it has a pulse width "0". Upon a signal of E waveform rise, the pulse generator 20 produces a series of pulses F with a specific width. This series of pulses F is given a specific delay by the delay circuit 21, yielding a waveform G. The waveform G and the waveform E are compared by the discriminating circuit 22. If the waveform E is high-level in the presence of a pulse of the waveform G, the logic "1" is generated; and if the waveform E is low-level, the logic "0" is generated. Meanwhile the counter 23 counts the waveform F so that an "end" signal can be issued when a specific number of pulses comes. Upon the "end" signal the control piece 15 is shifted downward in FIG. 3 to stop the rotation of the drum. If the waveforms G and H, and the "end" signal are fed to CPU 24, a computerized meter-checking be realized.

In the above description, only the data on the binary readings of the counter are issued from the oscillators $6a - 6a^{n-1}$, but it may be so designed with an increased number of oscillators, hold pieces and pins that a "data start" signal, a "data end" signal etc. can be issued. When data is not transmitted over the telephone channel, microswitches or piezoelectric elements may be set in opposition to the cam pieces $2 - 2^{n-1}$ so that the V-groove 2a or convex part 2b of the cam piece can be sensed and the binary code there can be converted to an electric signal.

Figure 8:
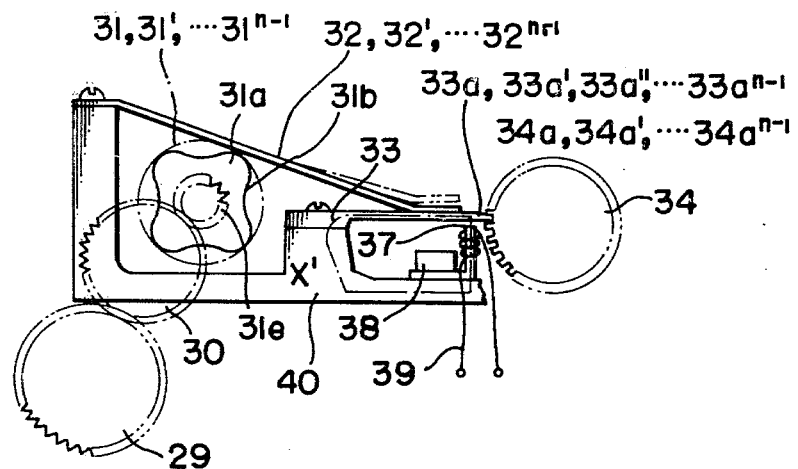
FIG. 8 is a front elevation view of a device as a second embodiment of the present invention.
Figure 9:
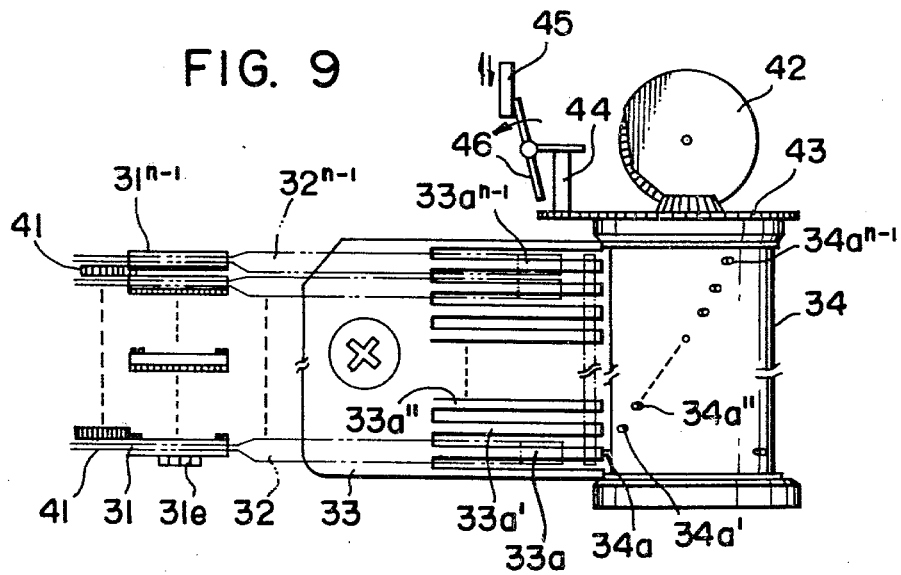
FIG. 9 is a plan view of the principal part of the device in FIG. 8.
Figure 10:
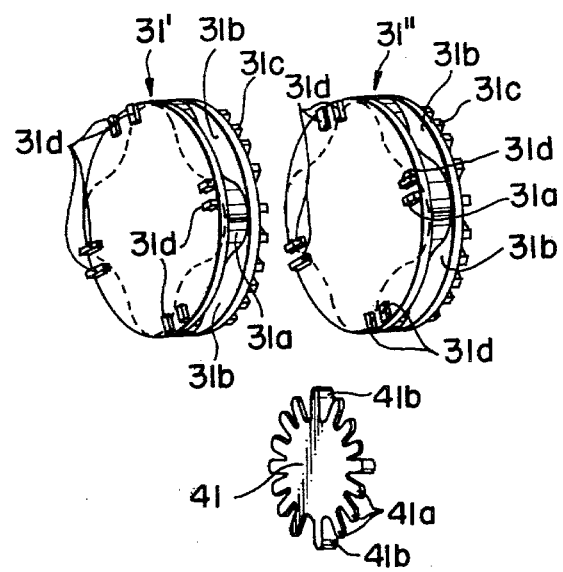
FIG. 10 is an oblique view of a cam attached to the device in FIG. 8.

FIGS. 8 to 10 illustrate the second embodiment of the present invention. 29 denotes a figure-wheel in a gas- or water meter-gauge which indicates the lowest digit of the readings to be taken by the figure-wheel. 31, 31'—$31^{n-1}$ are binary cam pieces which are arranged parallel in quantities matching the digits of data. On the outer circumference of each cam piece the convex 31a and the concave 31b are provided alternately. On one side of the cam piece the teeth 31c are arranged at equal intervals and on the other side the digit-adding teeth 31d are provided a little apart from the convex 31a.

Between adjacent cam pieces there are digit-adding gears 41, on which the wide teeth 41b which mesh with both the teeth 31c and the digit-adding teeth 31d are provided at equal intervals and the narrow teeth 41a which mesh only with the teeth 31c are provided at equal intervals between said wide teeth 41b.

30 is a medium gear to transmit the rotation of the figure-wheel 29 to the gear 31e integrated to the lowest cam piece 31. $32 - 32^{n-1}$ are hold pieces with one end fixed to the base 40, the other end opposing to and free to contact with the oscillators $33a - 33a^{n-1}$ of the oscillating valve 33 and the middle part bearing against the concave 31b or the convex 31a of the cam pieces $31 - 31^{n-1}$. The oscillators $33a - 33a^{n-1}$ are equal in length. A pick-up 37 is provided with a specific gap to the bottom of the oscillators $33a - 33a^{n-1}$. A magnet 38 is fitted to this pickup 37. Said magnet 38, said pickup 37, the base frame 40, the oscillation valve 33, and the oscillators $33a - 33a^{n-1}$ constitute a magnetic circuit X'.

The pickup 37 is wound with a coil 39, which gives an output from its end. 42 is a barrel provided in, say, a music box and it holds a coil spring therein. The released energy of this coil spring is transmitted as a torque to the drum 34 via the wheel row 43, 46 is a weather vane to which a torque of the wheel row 43 is transmitted via the wheel row 44 and which is rotated in the arrow direction. 45 is a control piece which pops in or out of the range of movement of the vane 46 and it is operated by an external signal. $34a - 34a^{n-1}$ are pins arranged spirally around the drum 34 so that they can successively flip the oscillators $33a - 33a^{n-1}$. The constitution of a well-known music box applies to said oscillation valve 33, drum 34, barrel 42, wheel rows 43, 44 and vane 46.

Supposing the above constitution, the action in the second embodiment of FIGS. 8 - 10 is described here.

The figure-wheel 29 turns one figure only, as the reading of the lower figure-wheel changes from "9" to "0". This turning of the figure-wheel 29 is transmitted by the medium gear 30 to the cam piece 31, causing ½ rotation from the convex 31a to the concave 31b or from the concave 31b to the convex 31a (hereafter this action is called one step rotation). Next, when the figure-wheel 29 turns for one figure and the cam piece 31 makes one step rotation, the digit-adding teeth 31d of the cam piece 31 mesh with the wide teeth 41b of the digit-adding gear 41, whereby one step rotation of the cam piece 31 is transmitted to the cam piece 31', causing one step rotation of the cam piece 31'. In other words, for every two steps of the rotation of a lower cam piece, an upper cam piece makes one step rotation and by successive repetition of this action binary digit-adding can be done by the cam pieces $31 - 31^{n-1}$.

If the convex 31a of the cam piece is deemed "1" and the concave 31b of it is deemed "0", the cam pieces $31 - 31^{n-1}$ can convert the decimal readings of the meter-gauge to the binary ones. The hold pieces $32 - 32^{n-1}$ take a one dot-chain line position of FIG. 8 when they are pressed by the convex 31a of the corresponding cam pieces $31 - 31^{n-1}$; and they are off the corresponding oscillators $33a - 33a^{n-1}$. When they come opposite to the concave 31b, they take a solid line position of FIG. 8 and at this position they are in contact with the corresponding oscillators $33a - 33a^{n-1}$.

When you want to check the readings of the gauge, you give an external signal to shift the control piece 45 upward in FIG. 9, thereby disengaging it from the vane 46.

Thereupon the wheel row 44 becomes free to rotate and the released energy of the spring is transmitted as a torque to the drum 34 via the wheel row 43. Subsequent process is the same as in the first embodiment.

Figure 11:
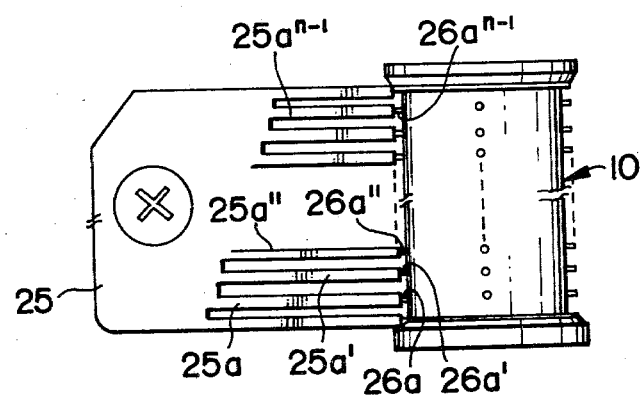
FIG. 11 is a plan view of the principal part of a device as a third embodiment of the invention.

FIG. 11 illustrates the third embodiment of the invention. The feature of this embodiment lies in that the oscillators $25a$ - $25a^{n-1}$ formed on the oscillation valve 25 are designed progressively shorter and the pins $26a$ - $26a^{n-1}$ jutting from the drum 10 are arranged parallel in a row. Since the oscillators $25a$ - $25a^{n-1}$ are thus progressively shorter in this embodiment, their frequencies are progressively higher. If such oscillators and drum are applied in the first and second embodiments, it will be possible to obtain an output waveform of mixed frequency of each one from the out-put ends of the coils 8, 39 by making the pins $26a$ - $26a^{n-1}$ simultaneously flip these oscillators $25a$ - $25a^{n-1}$, because these oscillators matching respective digits of the binary code have entirely different frequencies. When said output waveform is reproduced at the receiving end, the data can be reproduced by separating the frequency components through filters corresponding to respective frequencies. This is not a case of transmitting the data in series as in the preceding embodiments, but a case of transmitting them in parallel; therefore the transmitting time can be cut down.

Figure 12:
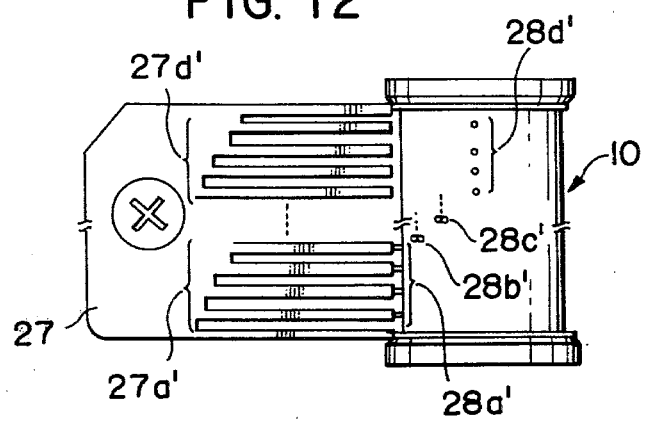
FIG. 12 is a plan view of the principal part of a device as a fourth embodiment of the present invention.

FIG. 12 illustrates the fourth embodiment of the invention. The feature of this embodiment lies in that the binary codes representing the figures on the figure-wheel are made to match the oscillator sets $27a'$—$27d'$ of the oscillation valve 27 and these oscillator sets are successively flipped by the pin sets $28a'$ - $28d'$, whereby an AC signal comprising four frequency components is obtained from the output ends of the coils 8, 39. The data of the figure-wheel can be taken out in series by repeating this process until the oscillator set $27d'$ is flipped by the pin set $28d'$. Needless to say, the mixed frequency components in the AC signal can be simply separated by passing them through a filter of each frequency at the receiving end.

Figure 13:
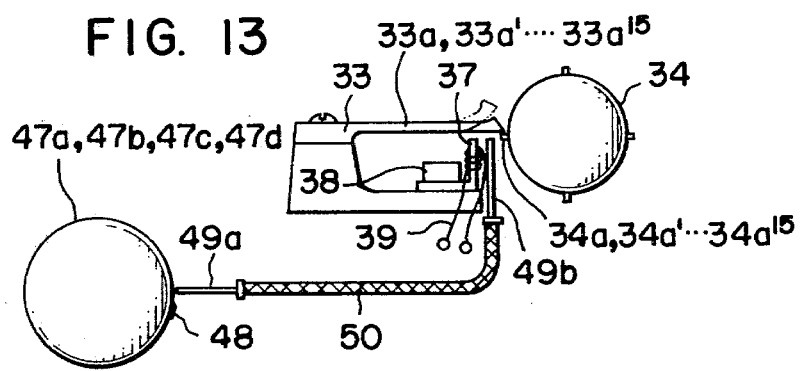
FIG. 13 is a front elevation view of a device as a fifth embodiment of the invention.
Figure 14:
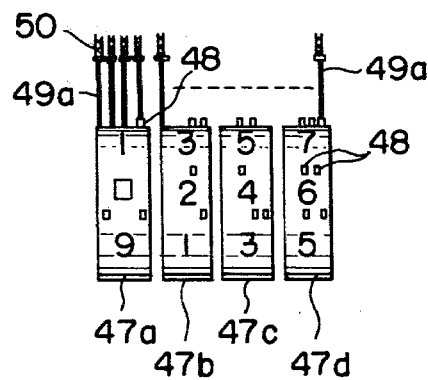
FIG. 14 is a plan view of the principal part of the device in FIG. 13.
Figure 15:
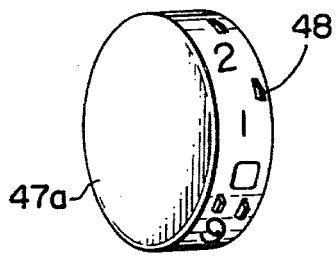
FIG. 15 is an oblique view of a cam attached to the device in FIG. 13.

FIGS. 13 - 15 illustrate the fifth embodiment of the invention. The figure on each of the figure-wheel $47a$ - $47d$ in the meter-gauge is rendered into binary codes by the projection 48. In FIG. 14 for the instance, the FIG. "7" on the figure-wheel $47d$ is represented by "0111", if the projection 48 is deemed the logic "1". A probe $49a$ faces the figure-wheel thus rendered into binary codes. In the embodiment as shown in these figures there are $4\times4=16$ probes $49a$ arranged in parallel. Among the probes $49a$, a probe $49a$ which sits on the projection 48 pushes up the matching probe $49b$ via a flexible wire 50. In consequence the matching oscillators $33a$, $33a'$—$33a^{15}$ are lifted as indicated by a broken line in FIG. 13, and therefore they cannot engage the pins on the drum. Thus when the drum 34 turns to make the pins $34a$ - $34a^{15}$ (in this case, the necessary digits of the binary data are four and accordingly 16 pins and oscillators suffice) simultaneously flip the oscillators $33a$ - $33a^{15}$, the oscillator for the logic "1" is not hit by the pin and therefore it does not oscillate, while the oscillator for the logic "0" is hit by the pin and oscillates. Thereupon an AC signal of binary code emerges from the output end of the coil 39 (said signal comprises the frequency components of the oscillators $33a$ - $33a^{15}$).

It would be possible to apply the binary code figure-wheel of FIGS. 13 - 15 to the first or second embodiment.

In the fifth embodiment the oscillation of the oscillator is magnetically changed to an AC signal by means of the pickup 37, the magnet 38 and the coil 39, but a piezoelectric element, a condensor, etc. may be employed instead.

INDUSTRIAL APPLICABILITIES OF THE INVENTION

The converter of meter-gauge readings according to the present invention can be applied at home or plant; it is highly useful for checking the readings of a gas-, a water-or an electric power meter-gauge by automatic remote-control method; and being simple in constitution, low-cost and exact in measuring, it has potentially great industrial applicabilities.

What is claimed is:

1. A meter-gauge reading converter comprising:
a plurality of cam pieces rotating with a counting action of a meter gauge, said cam pieces converting the counting action into a binary code, said cam pieces having concaves and convexes formed in a circumferential direction on circumferential faces corresponding to binary digits, said cam pieces having teeth circumferentially on one side thereof and digit-adding teeth on the other side thereof;
a digit-adding gear located between two adjacent cam pieces, said digit-adding gear meshing with teeth on said one side of one of said adjacent cam pieces, said digit-adding gears teeth having wide teeth with a constant pitch at a constant interval for binary condification which intermittently mesh with said digit-adding teeth on the remaining of said adjacent cam pieces, said digit-adding gear effecting raising of the digit in said remaining adjacent cam piece;
a plurality of oscillators having a first end fixed and a remaining end opposed respectively to the face of a cam piece;
hold pieces of flexible material each having one end fixed and the other end opposed to one of said oscillators, said hold pieces other ends being positioned to be displaceable by a convex as corresponding cam piece rotates, whereby said hold piece is urged into contact with said oscillator suppressing an oscillation of said oscillator;
means for successively flexing said oscillators at the time said readings are to be detected; and
means for detecting the vibration of oscillators whereby a first set of oscillations are detected when said hold piece is adjacent a concave and a second set of oscillations are detected when said hold piece is adjacent said convex indicating a binary digit represented by said cam position.

2. A converter of claim 1, wherein the concave of said cam pieces is a V-groove; a V-bend to engage said V-groove is provided on the middle part of said hold pieces; and said hold pieces are made of springs.

3. A converter of claim 1, wherein said oscillators are constituted each as a comb formed at one end of an integral oscillation valve.

4. A converter of claim 1, wherein said hold pieces are each constituted from an integral plate.

5. A converter of claim 1, 2, 3 or 4, wherein said means for flexing said oscillators is constituted of a drum with a plurality of pins on the periphery thereof, a spring to drive and rotate said drum, and a governor to control the force exerted by said spring.

6. A converter of claim 5, wherein said pins of said drum are disposed in a spiral.

7. A converter of claim 5, wherein said pins of said drum are arranged in parallel and said oscillators have successively different frequencies.

8. A converter of claim 5, wherein said oscillators are provided in sets and said pins in sets matching said sets of oscillators are in a row within each set and their sets are spirally disposed.

9. A converter of meter-gauge readings, such as readings of a measuring counter and a vane which is rotated via said wheel row.

10. A converter of meter-gauge readings of claim 9, wherein a control piece is provided to pop in or out of the rotating path of said vane.

11. A converter of claim 1, wherein said means for detecting the oscillation of said oscillators comprises a pickup attached to a machine frame in spaced opposition to said oscillators, a coil wound around said pickup and a magnet to generate a magnetic flux in the magnetic circuit comprising said oscillators, said machine frame and said pickup.

* * * * *